(12) United States Patent
Rohatgi et al.

(10) Patent No.: US 8,921,968 B2
(45) Date of Patent: Dec. 30, 2014

(54) SELECTIVE EMITTER SOLAR CELLS FORMED BY A HYBRID DIFFUSION AND ION IMPLANTATION PROCESS

(75) Inventors: Ajeet Rohatgi, Marietta, GA (US);
Vijay Yelundur, Canton, GA (US);
Preston Davis, Atlanta, GA (US);
Vinodh Chandrasekaran, Suwanee, GA (US); Ben Damiani, Atlanta, GA (US)

(73) Assignee: Suniva, Inc., Norcross, GA (US)

( * ) Notice: Subject to any disclaimer, the term of this patent is extended or adjusted under 35 U.S.C. 154(b) by 0 days.

(21) Appl. No.: 13/301,372

(22) Filed: Nov. 21, 2011

(65) Prior Publication Data
US 2012/0125416 A1    May 24, 2012

Related U.S. Application Data

(62) Division of application No. 12/793,334, filed on Jun. 3, 2010, now Pat. No. 8,071,418.

(51) Int. Cl.
*H01L 31/102*  (2006.01)
*H01L 31/068*  (2012.01)
*H01L 31/0236*  (2006.01)
*H01L 21/266*  (2006.01)
*H01L 21/263*  (2006.01)
*H01L 31/18*  (2006.01)
*H01L 21/265*  (2006.01)

(52) U.S. Cl.
CPC .......... *H01L 31/1804* (2013.01); *H01L 31/068* (2013.01); *H01L 31/02363* (2013.01); *H01L 21/266* (2013.01); *H01L 21/263* (2013.01); *Y02E 10/547* (2013.01); *H01L 21/26513* (2013.01)
USPC .................... 257/463; 257/E31.032; 136/252

(58) Field of Classification Search
None
See application file for complete search history.

(56) References Cited

U.S. PATENT DOCUMENTS

| | | | |
|---|---|---|---|
| 6,091,021 A | 7/2000 | Ruby et al. | |
| 6,552,414 B1* | 4/2003 | Horzel et al. | 257/655 |
| 2004/0112426 A1 | 6/2004 | Hagino | |
| 2007/0169808 A1* | 7/2007 | Kherani et al. | 136/258 |
| 2009/0025786 A1* | 1/2009 | Rohatgi et al. | 136/256 |
| 2009/0142875 A1 | 6/2009 | Borden et al. | |
| 2009/0211626 A1* | 8/2009 | Akimoto | 136/252 |

(Continued)

OTHER PUBLICATIONS

International Searching Authority, International Search Report and Written Opinion for International Application No. PCT/US2011/036720, mailed Jun. 27, 2012, 15 pages, European Patent Office, The Netherlands.

(Continued)

*Primary Examiner* — Wensing Kuo
(74) *Attorney, Agent, or Firm* — Ballard Spahr LLP

(57) ABSTRACT

Solar cells and methods for their manufacture are disclosed. An example solar cell may comprise a substrate comprising a p-type base layer and an n-type selective emitter layer formed over the p-type base layer. The n-type selective emitter layer may comprise one or more first doped regions comprising implanted dopant and one or more second doped regions comprising diffused dopant. The one or more first doped regions may be more heavily doped than the one or more second doped regions. A p-n junction may be formed at the interface of the base layer and the selective emitter layer, such that the p-n junction and the selective emitter layer are both formed during a single anneal cycle.

12 Claims, 4 Drawing Sheets

(56) References Cited

U.S. PATENT DOCUMENTS

Figure 1:
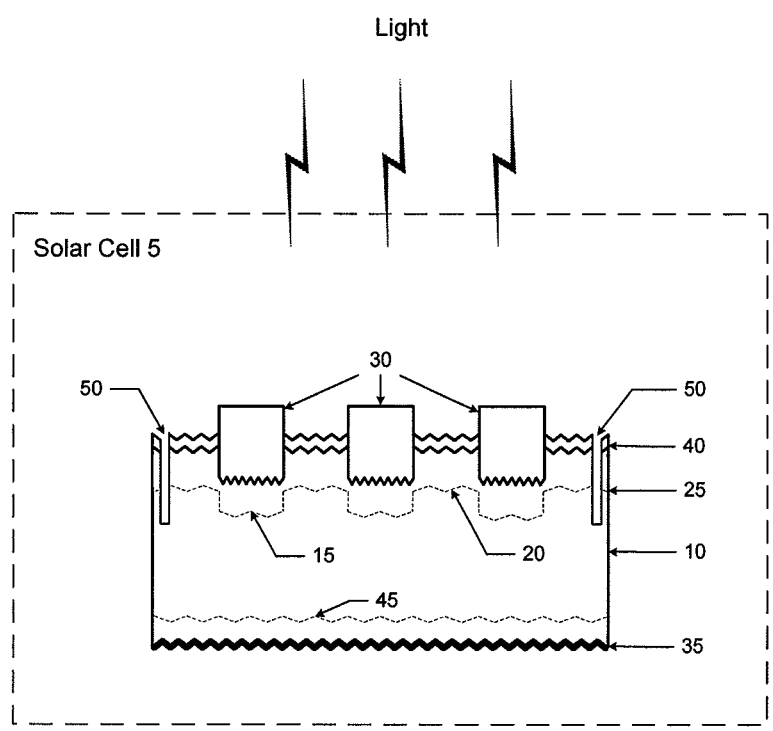

| | | |
|---|---|---|
| 2009/0227061 A1 | 9/2009 | Bateman et al. |
| 2009/0227062 A1 | 9/2009 | Sullivan et al. |
| 2009/0227094 A1 | 9/2009 | Bateman et al. |
| 2009/0227095 A1 | 9/2009 | Bateman et al. |
| 2009/0227097 A1 | 9/2009 | Bateman et al. |
| 2009/0308439 A1 | 12/2009 | Adibi et al. |
| 2009/0308440 A1 | 12/2009 | Adibi et al. |
| 2009/0308450 A1 | 12/2009 | Adibi et al. |
| 2009/0309039 A1 | 12/2009 | Adibi et al. |
| 2009/0317937 A1 | 12/2009 | Gupta et al. |
| 2010/0015750 A1* | 1/2010 | Shen et al. ............ 438/72 |
| 2010/0041176 A1 | 2/2010 | Sullivan et al. |
| 2010/0059362 A1 | 3/2010 | Anella |
| 2010/0124799 A1 | 5/2010 | Blake et al. |
| 2010/0197125 A1 | 8/2010 | Low et al. |
| 2010/0197126 A1 | 8/2010 | Bateman et al. |
| 2010/0224240 A1 | 9/2010 | Bateman et al. |
| 2010/0243041 A1* | 9/2010 | Carlson et al. ............ 136/255 |
| 2010/0297782 A1 | 11/2010 | Riordon et al. |
| 2010/0308236 A1 | 12/2010 | Carlson et al. |
| 2010/0314559 A1 | 12/2010 | Vopat et al. |
| 2011/0039367 A1 | 2/2011 | Bateman et al. |
| 2011/0089342 A1 | 4/2011 | Daniels et al. |
| 2011/0089343 A1 | 4/2011 | Daniels et al. |
| 2011/0092059 A1 | 4/2011 | Daniels et al. |
| 2011/0097840 A1 | 4/2011 | Ramappa |
| 2011/0104618 A1 | 5/2011 | Bateman et al. |
| 2011/0177652 A1 | 7/2011 | Gupta et al. |
| 2011/0180131 A1 | 7/2011 | Mullin et al. |

OTHER PUBLICATIONS

International Preliminary Examining Authority, Written Opinion for International Application No. PCT/US2011/036720, mailed Nov. 7, 2012, 6 pages, European Patent Office, Germany.

Janssens, T., et al., "Advanced Phosphorus Emitters for High Efficiency Si Solar Cells," 24th European Photovoltaic Solar Energy Conference, Hamburg, Germany, Sep. 21-25, 2009, pp. 1843-1846, IEEE, USA.

Müller, M., et al., "Silicon LPE on Substrates from Metallurgical Silicon Feedstockn for Large Scale Production," 3rd World Conference on Photovoltaic Energy Conversion, Osaka, Japan, May 11-18, 2003, pp. 1221-1224, IEEE, USA.

Bultman, Jan, et al., "Methods of Emitter Formation for Crystalline Silicon Solar Cells," Photovoltaics International, May 31, 2010, pp. 69-80, retrieved from the Internet: <http://www.Photovoltaicsinternational.com/technical_papers/methods_of_emitter_formation_for_crystalline_silicon_solar_cells>.

Rohatgi, Ajeet, et al., "Developing Novel Low-Cost, High-Throughput Processing Techniques for 20%-Efficient Monocrystalline Silicon Solar Cells,"Photovoltaics International, Nov. 2010, pp. 87-93, 10th Edition, IEEE, USA.

Kuthi, E. B., et al., "PIII Solar Cell with Self-Doping Contacts for Indoor Application," Proceedings of 21st European Photovoltaic Solar Energy Conference, Dresden, Germany, Sep. 4-8, 2006, pp. 1057-1059

United States Patent and Trademark Office, Office Action for U.S. Appl. No. 12/973,334, mailed Jun. 7, 2011, 12 pages, USA.

United States Patent and Trademark Office, Notice of Allowance and Fee(s) Due for U.S. Appl. No. 12/793,334, mailed Aug. 10, 2011, 5 pages, USA.

Kreinin et al., "Combined Thermal Diffusion—Ion Implantation Fabrication Processing for Silicon Solar Cells," Opto-Electroncs Review, 2000, pp. 317-322, No. 4.

Meemongkolkiat et al., "Investigation of RTP and Belt Fired Screen Printed A1-BSF on Textured and Planar Back Surfaces of Silicon Solar Cells," 3rd World Conference on Photovoltaic Energy Conversion, Georgia Institute of Technology, May 11-18, 2003, 4 pages total.

Ebong et al., "Development of Front Silver Paste for Producing Fine Lines and High Quality Contacts to 100Ω-SQ Emitters With Low Surface Phosphorus Concentration," 23th European Photovoltaic Solar Energy Conference, Valencia, Sep. 1-5, 2008, pp. 1713-1716.

Kerr et al., "Surface Recombination Velocity of Phosphorus-Diffused Silicon Solar Cell Emitters Passivated With Plasma Enhanced Chemical Vapor Deposited Silicon Nitride and Thermal Silicon Oxide," Journal of Applied Physics, Apr. 1, 2001, vol. 89, No. 7, pp. 3821-3826.

Antoniadis, "Silicon Ink High Efficiency Solar Cells," 34th IEEE Photovoltaic Specialists Conference (PVSC), 2009, pp. 650-654.

Monna et al., "17.8% Efficiency Obtained on C-Si Solar Cells Using a Selective Emitter Industrial Type Process," 23rd EU-PVSEC Valencia, 2008, 4 pages total.

Book et al., "Two Diffusion Step Selective Emitter: Comparison of Mask Opening by Laser or Etching Paste," 23rd EU-PVSEC Valencia 2008, 4 pages total.

Dastgheib-Shirazi et al., "Selective Emitter for Industrial Solar Cell Production: A Wet Chemical Approach Using a Single Side Diffusion Process," 23rd EU-PVSEC Valencia, 2008, 3 pages total.

Röder et al., "0.4% Absolute Efficiency Gain of Industrial Solar cells by Laser Doped Selective Emitter," 34th IEEE Photovoltaic Specialists Conference (PVSC), 2009, pp. 871-873.

Jeon et al., "Emitter Formation Using Ion Implatation Method for Fabrication of Crystalline Silicon Solar Cells," 25th EU-PVSEC, Valencia, Sep. 2010, pp. 2438-2441.

Westbrook, "Glow-Discharge-Implanted, Thermally Annealed, Oxide-Passivated Silicon Solar Cells of 19% Efficiency," Applied Physics Letters, Feb. 23, 1987, pp. 469-471.

Douglas et al., "A Study of the Factors Which Control the Efficiency of Ion-Implanted Silicon Solar Cells," IEEE Transactions on Electron Devices Apr. 1980, pp. 792-802, vol. 27, Issue 4.

Minnucci et al., "Tailored Emitter, Low-Resistance, Ion-Implanted Silicon Solar Cells," IEEE Transactions on Electron Devices, Apr. 1980, pp. 802-806, vol. 27, Issue 4.

Spitzer et al., "High-Efficiency Ion-Implanted Silicon Solar Cells," IEEE Transactions on Electron Devices, May 1984, vol. 31, Issue 5, pp. 546-550.

Keavney et al., "Solar Cell Junction Profiles in Ion-Implanted Texture-Etched Surfaces," Journal of Applied Physics, Jul. 15, 1984, pp. 592-593.

Bordin et al., "Recombination Parameters of Si Solar Cells with Back Surface Field Formed by Ion Implantation," 4th World Conference on Photovoltaic Energy Conversion, 2006, pp. 1171-1174.

Gupta et al., "High Efficiency Selective Emitter Cells Using In-Situ Patterned Ion-Implantation," 25th EU-PVSEC, Valencia, Sep. 2010, pp. 1158-1162.

* cited by examiner

SELECTIVE EMITTER SOLAR CELLS FORMED BY A HYBRID DIFFUSION AND ION IMPLANTATION PROCESS

CROSS-REFERENCE TO RELATED APPLICATIONS

This application is a divisional of U.S. application Ser. No. 12/793,334, filed on Jun. 3, 2010, which is hereby incorporated herein in its entirety by reference.

TECHNOLOGICAL FIELD

The present invention is generally directed to a selective emitter solar cell formed by a hybrid diffusion and ion implantation process, and methods for its manufacture. The hybrid diffusion and ion implantation process only requires a single high-temperature anneal to form the selective emitter solar cell.

BACKGROUND

In basic design, a solar cell is composed of a material such as a semiconductor substrate that absorbs energy from photons to generate electricity through the photovoltaic effect. When photons of light penetrate into the substrate, the energy is absorbed and an electron previously in a bound state is freed. The released electron and the previously occupied hole are known as charge carriers.

The substrate is generally doped with p-type and n-type impurities to create an electric field inside the solar cell, called a p-n junction. In order to use the free charge carriers to generate electricity, the electrons and holes must not recombine before they can be separated by the electrical field at the p-n junction. The charge carriers that do not recombine can then be used to power a load.

A common method for producing solar cells begins with a substrate doped to have p-type conductivity. An n-type dopant is introduced to the front surface of the substrate to form an n-type emitter layer on top of a p-type base layer. Contacts are then formed on the front surface of the emitter layer and back surface of the base layer to allow electrical connections to be made. The free electrons are collected by the front contacts and the holes are collected by the back contacts.

Since the front contacts block some of the incident sunlight, it is advantageous not to cover too much of the front surface of the emitter layer with the contact material. Instead, a traditional approach involves forming contact points, lines, or grids. Some low-cost solutions for forming these contacts, such as screen-printing, may require heavily doping the emitter layer to reduce contact resistance between the front contacts and the underlying emitter layer. The use of heavy doping, however, increases charge carrier recombination in the emitter layer and at the emitter layer surface, which leads to a reduction in overall cell efficiency.

To overcome this disadvantage, various techniques may be used to form an emitter layer that is doped relatively heavily underneath the front contacts and relatively lightly in the exposed regions between the front contacts, which is known as a selective emitter. These techniques, however, suffer from one or more drawbacks such as the need for additional steps in the manufacturing process, an increase in lifetime degradation and instability, and incompatibility with high-volume manufacturing processes.

Therefore, there is a need in the art for producing selective emitter solar cells that overcome the above-mentioned and other disadvantages and deficiencies of previous technologies.

BRIEF SUMMARY OF SOME EXAMPLES OF THE INVENTION

Various embodiments of a silicon solar cell with selective emitter formed by a hybrid ion implantation and diffusion process and methods for its manufacture are herein disclosed. These embodiments of the invention overcome one or more of the above-described disadvantages associated with previous technologies. Embodiments of the invention provide several advantages for production of solar cells that reduce the time and cost required for their production.

A solar cell according to an example embodiment of the invention comprises a substrate having a p-type base layer. The solar cell has an n-type selective emitter layer formed over the p-type base layer. The selective emitter layer has one or more first doped regions comprising implanted dopant and one or more second doped regions comprising diffused dopant. The one or more first doped regions are more heavily doped than the one or more second doped regions. The solar cell also has a p-n junction at the interface of the p-type base layer and the selective emitter layer. The p-n junction and the selective emitter layer are both formed during a single anneal cycle.

A solar cell according to another example embodiment of the invention comprises a monocrystalline silicon substrate having a boron-doped p-type base layer. The solar cell has a phosphorus-doped selective emitter layer on the front surface of the p-type base layer formed by a hybrid diffusion-ion implantation process. The selective emitter layer has one or more first doped regions formed by ion implantation and one or more second doped regions formed by phosphorus oxychloride ($POCl_3$) diffusion. The one or more first doped regions are more heavily doped than the one or more second doped regions due to the additive dopant of the ion implantation step. The solar cell also has a p-n junction at the interface of the front surface of the p-type base layer and the back surface of the selective emitter layer, which is formed when the silicon substrate is subjected to a single anneal cycle. An antireflection layer, such as silicon nitride, aluminum oxide, titanium oxide, magnesium fluoride, or zinc sulfide, or combinations of these materials, is formed on the front surface of the selective emitter layer. One or more screen-printed, silver front contacts are formed on the front surface of the antireflection layer, and one or more screen-printed, aluminum back contacts are formed on the back surface of the p-type base layer. An aluminum-doped $p^+$ silicon back surface field layer is formed by liquid phase epitaxial regrowth at the interface of the back surface of the p-type base layer and the one or more back contacts. The one or more front contacts are aligned with the more heavily doped one or more first doped regions of the selective emitter layer to reduce contact resistance. The one or more front contacts are in electronic communication with the first doped regions of the selective emitter layer through the antireflection layer, and the one or more back contacts are in electronic communication with the aluminum-doped $p^+$ silicon back surface field layer.

According to an example embodiment of the invention, a method is disclosed for manufacturing a solar cell with selective emitter formed by a hybrid ion implantation and diffusion process. The method begins by providing a substrate comprising a boron-doped base layer. Phosphorus dopant is introduced to one or more selective regions of the front surface of the boron-doped base layer by ion implantation. Then, the substrate is subjected to a single high-temperature anneal cycle in a furnace. Additional liquid dopant in the form of $POCl_3$ is introduced to the furnace for diffusion into the front surface of the base layer during the single anneal cycle. The introduction of $POCl_3$ for diffusion eliminates iron contamination induced lifetime degradation and instability in the selective emitter solar cell. A selective emitter layer is formed on the front surface of the base layer such that one or more selective regions of the selective emitter layer overlying the one or more selective regions of the front surface of the base layer are more heavily doped than the remainder of the selective emitter layer. The anneal cycle heals the implant damage, activates the phosphorus dopant, and drives the phosphorus dopant to a desired junction depth in the substrate.

The method also comprises depositing an amorphous silicon nitride layer on the front surface of the selective emitter layer thereby forming an antireflection coating. One or more front silver contacts are screen-printed on the front surface of the amorphous silicon nitride antireflection layer in alignment with the more heavily doped one or more selective regions of the selective emitter layer. One or more front silver connections, such as solderable pads or bus bars, are also screen-printed on the amorphous silicon nitride layer. One or more back silver-aluminum connections, such as solderable pads or bus bars, and one or more back aluminum contacts are screen-printed on the back surface of the base layer. The front and back contacts and connections are co-fired in a belt furnace to create the front and back contacts and connections by firing through the antireflection layer. The one or more front contacts are in electronic communication with the one or more selective regions of the selective emitter layer through the amorphous silicon nitride antireflection layer. An aluminum-doped $p^+$ silicon back surface field layer is formed by liquid phase epitaxial regrowth at the interface of the back surface of the base layer and the one or more back contacts during the co-firing of the front and back contacts. The one or more back contacts are in electronic communication with the back surface field layer.

According to another embodiment of the invention, a method is disclosed for manufacturing a solar cell with selective emitter formed by a hybrid ion implantation and diffusion process. The method begins by providing a p-type substrate. The substrate is annealed, which comprises heating the substrate in a furnace at a relatively high temperature to diffuse n-type dopant into the front surface of the substrate, form an intermediate uniform emitter layer, and form a glass layer on the front surface of the intermediate uniform emitter layer. The n-type dopant is introduced to the furnace during the anneal for diffusion. The substrate is then removed from the furnace. The glass layer is removed from the front surface of the intermediate uniform emitter layer. Additional n-type dopant is introduced to one or more selective regions of the front surface of the intermediate uniform emitter layer by ion implantation. The substrate is annealed, which comprises heating the substrate in a furnace to a relatively low temperature to heal the implant damage, activate the additional n-type implanted dopant, drive the additional n-type implanted dopant to a desired junction depth, and convert the intermediate uniform emitter layer into a selective emitter layer. The one or more selective regions of the intermediate uniform layer define one or more selective regions of the selective emitter layer that are more heavily doped than the remainder of the selective emitter layer.

According to another example embodiment of the invention, a method is disclosed for manufacturing a solar cell with selective emitter formed by a hybrid ion implantation and diffusion process. The method begins by providing a substrate comprising a base layer. Dopant is introduced to one or more selective regions of the front surface of the base layer by ion implantation. The substrate is annealed, which comprises heating the substrate in a furnace to a temperature to diffuse additional dopant into the front surface of the base layer and form a selective emitter layer on the front surface of the base layer. The additional dopant is introduced to the furnace during the anneal. The one or more selective regions of the front surface of the base layer define one or more selective regions of the selective emitter layer that are more heavily doped than the remainder of the selective emitter layer.

Another example embodiment of the invention is directed to a solar cell with selective emitter formed by a hybrid ion implantation and diffusion process formed with the above-identified method.

The above summary is provided merely for purposes of summarizing some example embodiments of the invention so as to provide a basic understanding of some aspects of the invention. Accordingly, it will be appreciated that the above described example embodiments should not be construed to narrow the scope or spirit of the invention in any way more restrictive than as defined by the specification and appended claims. It will be appreciated that the scope of the invention encompasses many potential embodiments, some of which will be further described below, in addition to those here summarized.

BRIEF DESCRIPTION OF THE DRAWING(S)

Figure 2A:
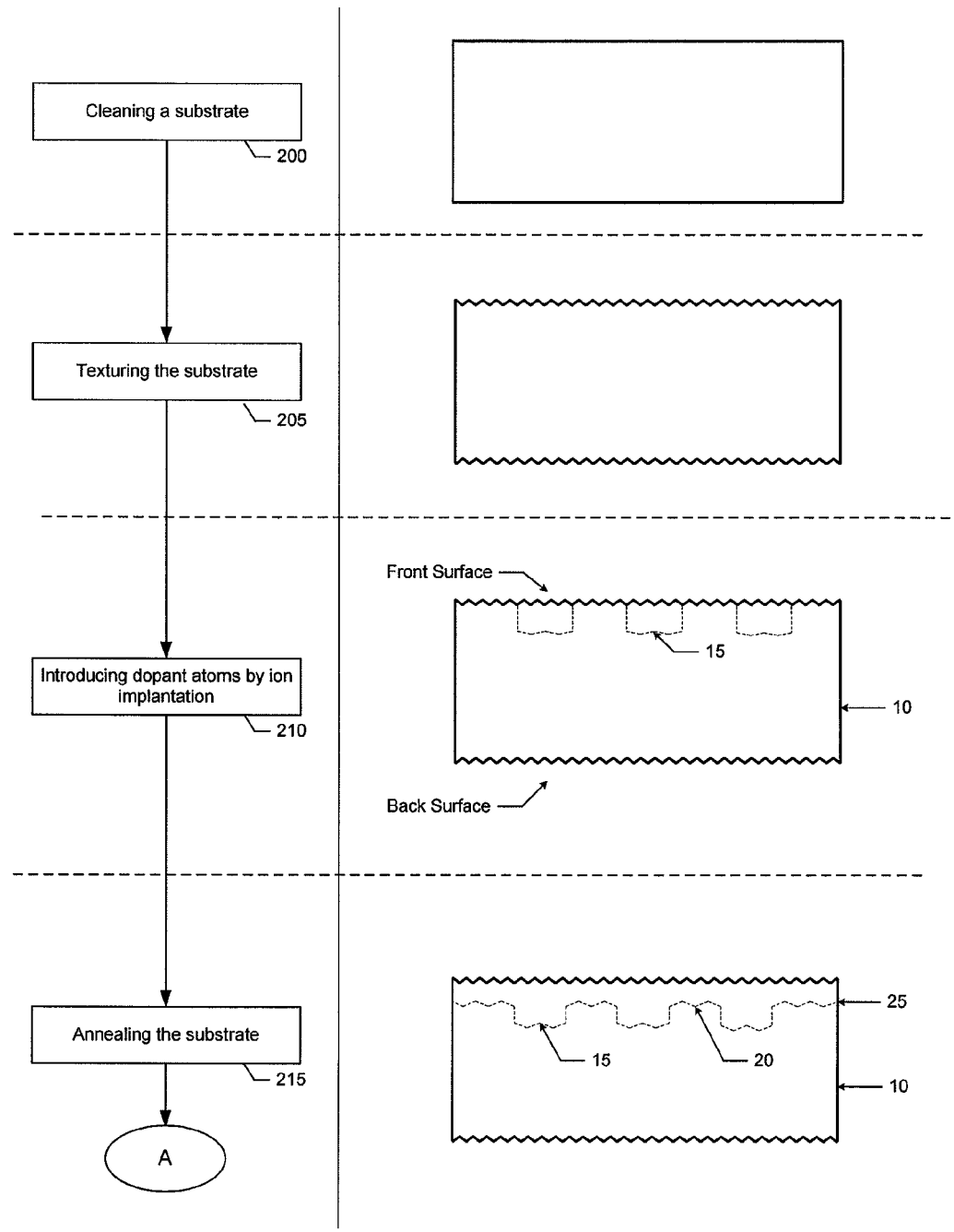
Figure 2B:
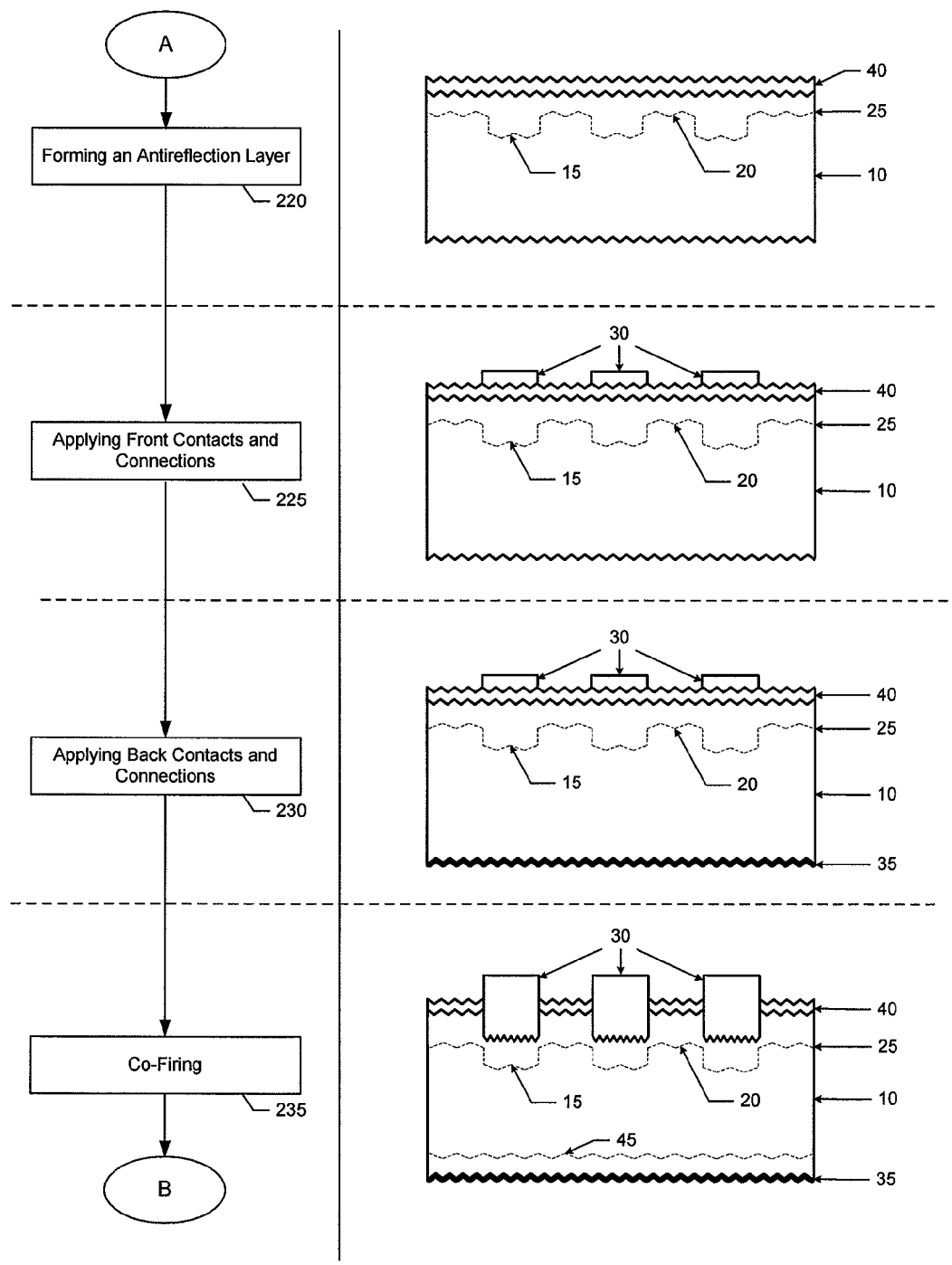
Figure 2C:
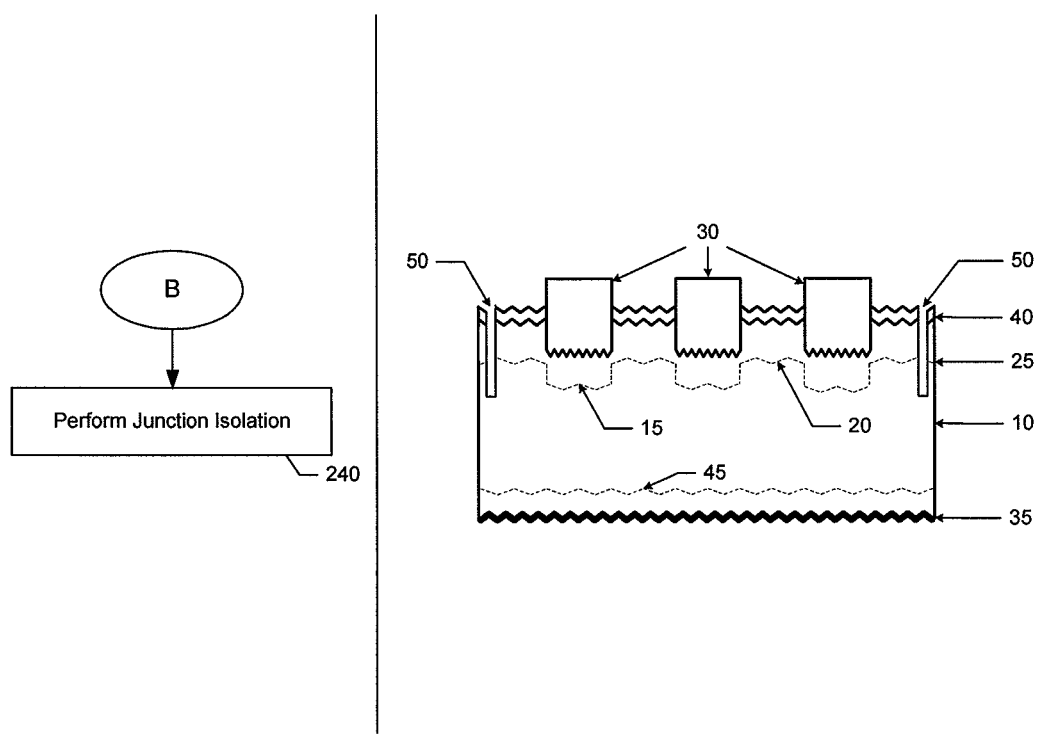

Having thus described embodiments of the invention in general terms, reference will now be made to the accompanying drawings, which are not necessarily drawn to scale, and wherein:

FIG. 1 illustrates a cross-sectional view of a solar cell in accordance with an example embodiment of the present invention; and FIGS. 2a, 2b, and 2c illustrate a flowchart according to an example embodiment of a method for manufacturing a solar cell of the present invention.

DETAILED DESCRIPTION

Some embodiments of the present invention will now be described more fully hereinafter with reference to the accompanying drawings, in which some, but not all embodiments of the invention are shown. Those skilled in this art will understand that the invention may be embodied in many different forms and should not be construed as limited to the embodiments set forth herein; rather, these embodiments are provided so that this disclosure will satisfy applicable legal requirements. Like reference numerals refer to like elements throughout.

Selective emitter structures help bridge the gap between high-efficiency, expensive silicon solar cells made in the laboratory and low-cost, but lower efficiency, cells manufactured in industry. Most industrial silicon solar cells utilize low-cost, screen-printed metal contacts that require heavily doped emitter layers in order to reduce contact resistance to acceptable levels, for example less than 5 $m\Omega\text{-}cm^2$. Silicon solar cells with heavily doped uniform emitters, however, suffer from increases in charge carrier recombination in the emitter and at the emitter surface, which leads to a loss in solar cell efficiency. The recombination may be reduced by utilizing selective emitters, which feature heavy doping under the contacts and light doping between the contacts. Reducing the front surface recombination velocity (FRSV), for example from 500,000 cm/s to 100,000 cm/s or even 10,000 cm/s or lower, may lead to higher solar cell efficiency when sheet resistance in the field region is increased, for example to 100 Ω/sq. The current approaches for forming a selective emitter all suffer from various drawbacks. The present invention, however, provides an improvement over the current state of the art by offering a simplified approach to creating selective emitters in only one high temperature step.

One approach to forming a selective emitter involves two separate diffusion steps, for example by phosphorus oxychloride ($POCl_3$) diffusion. This approach, however, may require additional steps in the manufacturing process. For example, two separate diffusions may require two separate high temperature heating steps. Additionally, this approach may require an additional step between the diffusions for deposition of a protective silicon nitride layer and patterning with a dielectric etch paste, laser removal etching, and/or expensive photolithography processing. These additional steps increase the time and cost of producing solar cells.

An alternate approach to forming a selective emitter is by ion implantation. The use of ion implantation advantageously eliminates the need for phosphosilicate glass removal and edge isolation steps that are required when forming a selective emitter by $POCl_3$ diffusion. A potential drawback of ion implantation, however, occurs during the anneal process when iron contamination may result in performance instability and power loss due to increased charge carrier recombination. The contaminating iron may be present in the substrate or it may enter the substrate from the process ambient. Under light exposure, iron-boron pairs are known to split into interstitial iron which has a midgap trap level (~0.4 eV) relative to the shallow trap level (~0.25 eV) for iron-boron. This dissociation of iron-boron pairs results in a light-induced instability that can be present in solar cells with ion implanted emitters.

The inventors have recognized that selective emitters formed by diffusion do not show signs of iron contamination because $POCl_3$ diffusion serves as a powerful gettering agent for iron. The $POCl_3$ diffusion creates misfit dislocations in the emitter that provide a sink for iron gettering. In addition, $POCl_3$ diffusion results in the injection of silicon interstitials that drive out iron from substitutional sites into interstitial sites where they can diffuse rapidly to the gettering sink in the emitter. In solar cells with ion implanted emitters, there is no phosphosilicate glass formation and fewer misfit dislocations since the post-implantation anneal is generally done in an ambient of oxygen and nitrogen rather than $POCl_3$. Therefore, iron remains in the bulk of the substrate where it can lower the bulk lifetime, which yields lower solar cell efficiency.

The inventors have discovered a new approach to forming selective emitters that avoid some of the drawbacks of the above approaches. Namely, a hybrid process of ion implantation and diffusion is used to create a selective emitter. In particular, selective regions of the front surface of the base layer of the substrate may be doped by ion implantation. Then, during a single high-temperature anneal cycle, additional dopant is introduced to the surface of the base layer by diffusion to supplement the implanted dopant in the selective regions and to lightly dope the field regions between the selective regions. The resulting solar cell exhibits reduced iron contamination and iron-induced instability due to the diffusion stage.

Furthermore, the process only requires a single high-temperature anneal cycle, for example from 800 to 1000 degrees Celsius, as the anneal not only activates and drives the implanted ions into the substrate, but the diffusion of additional dopant may also take place during the same heating cycle. As a result, high-volume, module-ready solar cells with a selective emitter may be produced in a single high-temperature anneal cycle using streamlined and industrial level only processes such that the selective region has a high enough dopant concentration at the surface and a deep enough junction underneath to give fill factors at or exceeding 0.800 and cell efficiencies of about 19%. These values are even possible with low-cost, but high-quality, screen-printed contacts.

FIG. 1 illustrates one embodiment of a solar cell 5 in accordance with the present invention. The solar cell 5 may be formed of a semiconductor substrate. The substrate may be composed of silicon (Si), germanium (Ge) or silicon-germanium (SiGe) or other semiconductive material, or it may be a combination of such materials. In the case of monocrystalline substrates, the semiconductor substrate may be grown from a melt using Float Zone (FZ) or Czochralski (Cz) techniques. The resulting monocrystalline boule may then be sawn into a wafer which may be polished to form the substrate. For a substrate composed of silicon, germanium or silicon-germanium, the crystallographic orientation of the wafer surface may be (100) or (110), for example. Alternatively, the substrate can be multi-crystalline, which may be less expensive than monocrystalline substrates. However, the multi-crystalline substrate suffers from recombination of charge carriers at crystal grain boundaries, and requires passivation to avoid efficiency losses.

The front and back surfaces of the substrate may define pyramidal structures created by their treatment with a solution of potassium hydroxide (KOH) and isopropyl alcohol (IPA) during an anisotropic etching process. The presence of these structures increases the amount of light entering the solar cell 5 by reducing the amount of light that is lost by reflection from the front surface. The pyramidal structures on the back surface may be destroyed during formation of a back contact.

According to the embodiment of FIG. 1, the substrate may be doped with impurities of a first conductivity type, for example p-type impurities to create a p-type base layer 10. If the substrate is composed of silicon (Si), germanium (Ge) or silicon-germanium (Si—Ge), the p-type base layer 10 may be doped with boron (B), gallium (Ga), indium (In), aluminum (Al), or possibly another Group III element to produce p-type conductivity. Alternatively, the substrate may be doped with phosphorus (P), antimony (Sb), arsenic (As) or other Group V element to induce n-type conductivity, thereby forming an n-type base layer. A selective emitter layer made up of heavily doped regions 15 and lightly doped regions 20 may be formed on the front surface of the p-type base layer 10, for example using a hybrid diffusion and ion implantation process. The heavily doped selective regions 15 and lightly doped field regions 20 may be doped with impurities of a second conductivity type opposite that of the first conductivity type, for example n-type impurities. A p-n junction 25 may be formed at the interface between the p-type base layer 10 and the doped regions 15, 20. Because of their opposite conductivities, the p-type base layer 10 and the doped regions 15, 20 create an electric field across the p-n junction 25 which separates free electrons and holes resulting from absorption of light photons and forces them to move in opposite directions to respective front and back contacts 30, 35.

An antireflection layer 40 may be formed on the front surface of the doped regions 15, 20 of the selective emitter layer to reduce reflection of the incident light and thus loss of solar energy. The antireflection layer 40 may have a refractive index less than that of the underlying substrate, which tends to cause light incident to the solar cell 5 to refract into the antireflection layer 40 and to the substrate where it can be converted to free charge carriers. For example, the antireflection layer 40 may have an index of refraction in the range of 1.9 to 2.4 when measured with an incident laser having a wavelength of 632.8 nm. The antireflection layer 40 may be composed of silicon nitride ($SiN_x$), aluminum oxide ($Al_2O_3$), titanium oxide ($TiO_2$), magnesium fluoride ($Mg_2F$), zinc oxide (ZnO), or zinc sulfide ($ZnS_2$), or combinations of these materials. In some embodiments, the antireflection layer 40 comprises an amorphous nitride, such as amorphous silicon nitride ($a$-$SiN_x$). The antireflection layer 40 may have a thickness from 10 to 100 nanometers.

The front and back contacts 30, 35 and front and back connections may be formed of conductive materials such as silver (Ag), aluminum (Al), or a combination of silver and aluminum. Generally, for silicon and other substrates, silver may be used to contact the surface of the substrate that is doped n-type, such as the doped regions 15, 20 of the selective emitter layer, and aluminum, silver, or silver with aluminum additive may be used to contact the surface of the substrate that is doped p-type, such as the p-type base layer. Direct contact of metal to a semiconductor increases the recombination rate of electrons and holes, which can significantly lower solar cell efficiency. To decrease this effect and limit the proportion of metal covering the surface of the substrate, the front and back contacts 30, 35 and connections may be configured as point or line contacts (sometimes called "local contacts"). The spacing and arrangement of point or line contacts can be determined as described in U.S. Publication No. 2009/0025786 published Jan. 29, 2009, which is incorporated by reference as if set forth in full herein.

The front and back contacts 30, 35 and connections may be formed by screen-printing the silver on the front surface of the antireflection layer 40 and the aluminum, silver, or silver with aluminum additive on the back surface of the p-type base layer 10. The front and back connections may comprise solderable pads or bus bars to facilitate electrical connections to the front and back surfaces of the solar cell 5. According to example embodiments, the pattern of the front connections may be aligned with the pattern of the back connections.

In addition, for the front contacts 30 and front connections, silver may be selected because of its high electrical conductivity to limit shadowing effects that can lower solar cell efficiency. Various commercial silver pastes are available for this purpose, such as Heraeus SOL953. However, silver is not transparent, so it may be desirable to limit the dimensions of the front contacts 30 and front connections to point or line contacts of limited area for this additional reason. To reduce the contact resistance between the front contacts 30 and the underlying selective emitter layer, the front contacts 30 are aligned with the heavily doped regions 15 of the selective emitter layer. In certain embodiments, the width of the front contacts 30 may be less than the width of the heavily doped regions 15 to ensure that the front contacts 30 are entirely within the heavily doped regions 15. The heavy doping in these selective regions also may increase the depth of the p-n junction 25 underneath, which may prevent shunting or firing through the p-n junction 25 by components of the metal paste used to form the front contacts 30. In accordance with certain embodiments, the antireflection layer 40 may be disposed on the front surface of the doped regions 15, 20 of the selective emitter layer prior to forming the front contacts 30 and front connections 55. In this case, the front contacts 30 and front connections 55 may physically penetrate the antireflection layer 40 to make contact with the underlying regions of the selective emitter layer. The front contacts 30 and front connections may contain glass frit in addition to metal to facilitate their firing through the antireflection layer 40 to make contact with the selective emitter layer.

The back contact 35 and back connections may be formed on the back surface of the p-type base layer 10 using screen printed pastes. The paste used to form the back contact 35 may comprise an aluminum paste, such as Monocrystal Analog 12D, or the like. Additionally, the paste used to form the back connections may comprise an aluminum-silver paste, such as Monocrystal PPAS-7-1, or the like. According to example embodiments, the back connections may be applied to the back surface of the p-type base layer 10 prior to the application of the back contact 35. The back contact 35 may be printed to overlap the edges of the back connections while leaving a portion of the back connections exposed. In some embodiments, the back contact 35 and back connections may cover nearly the entire back surface of the p-type base layer 10. Alternatively, the back contact 35 and back connections may only cover a portion of the back surface of the p-type base layer 10.

Due to the firing of the back contact 35, an aluminum-doped $p^+$ silicon back surface field layer 45 may be formed by liquid phase epitaxial regrowth at the interface of the back surface of the p-type base layer 10 and the back contact 35. In these embodiments, the back contact 35 may make electrical contact with the back surface of the aluminum-doped $p^+$ silicon back surface field layer 45. The back contact 35 may be composed of an aluminum-silicon eutectic composition. The back contact 35 may also serve as a reflective back layer for the solar cell 5. Having a reflective back layer provides a reflective surface to return incident light reaching the back to the substrate where it can generate free charge carriers. The thickness of the back contact 35 may be from 10 to 40 micrometers in thickness and provide adequate reflectivity.

FIGS. 2a, 2b, and 2c illustrate a flowchart according to an example method for manufacturing another example solar cell with selective emitter formed by a hybrid ion implantation and diffusion process according to an example embodiment of the present invention. FIGS. 2a, 2b, and 2c thus disclose the methods for its manufacture in accordance with the present invention.

Referring to FIGS. 2a, 2b, and 2c at operation 200 a substrate is provided. The substrate may be as described above with respect to FIG. 1. Normally, a substrate can be ordered from suppliers with a specified amount of p-type or n-type conductivity. According to various embodiments, the substrate may be doped with p-type dopant to form a p-type base layer 10. The dopant concentration may be in a range from $10^{15}$ to $10^{17}$ atoms per cubic centimeter (atoms/$cm^3$). The thickness of the substrate may be in a range from 50 to 500 μm, although savings of semiconductor material can be achieved relative to current standard substrates by using substrates with a thickness from 50 to less than 200 μm. Resistivity of the substrate may be in a range from 1 to 100 Ohm-cm, with excellent results obtained using 1 to 30 Ohm-cm. Monocrystalline or multicrystalline, or possibly string ribbon, thin-film or other types of substrates, may be used.

At operation 200, the substrate may be cleaned to prepare it for processing. The cleaning may be accomplished by immersion of the substrate in a bath of potassium hydroxide (KOH) having, for example, about a 1-10% concentration, to etch away saw damage on the surfaces of the substrate. According to some example embodiments, etching may be conducted at a temperature from about 60 to 90 degrees Celsius.

At operation 205, the substrate may be textured. For example, the substrate may be textured by anisotropically etching it by immersion in a bath of potassium hydroxide and isopropyl alcohol (KOH-IPA). According to some example embodiments, the potassium hydroxide concentration may be about a 1-10% concentration, and the isopropyl alcohol may be about a 2-20% concentration. The temperature of the KOH-IPA bath may be about 65 to 90 degrees Celsius. The KOH-IPA etches the surfaces of the substrate to form pyramidal structures with faces at the crystallographic orientation. The resulting pyramidal structures help to reduce reflectivity at the front surface and to trap light within the substrate where it can be absorbed for conversion to electric energy.

At operation 210, dopant, for example dopant atoms or ions, may be introduced to the front surface of the base layer 10 in selective regions 15. According to various embodiments, the dopant may be introduced by ion implantation. The dopant may have a conductivity type opposite to that of the base layer 10. Thus, if the base layer 10 has p-type conductivity, then the dopant introduced in operation 210 may have n-type conductivity. Conversely, if the base layer 10 has n-type conductivity, then the dopant may have p-type conductivity. In certain embodiments, the n-type dopant may be phosphorus ions, for example $P^{31+}$. Patterning of the selective regions 15 may be achieved by performing the ion implantation through a mask, for example a graphite mask. The graphite mask may have openings from 50 to 500 micrometers wide and having a length equal to or greater than the width of the substrate, for example 156 millimeters. During the implantation of operation 210, one edge of the substrate, known as the reference edge, may be aligned with the edge of the mask by gravity. Additionally, fiducials may be created on the reference edge, for example using a laser tool, which may be referenced in downstream process steps involving alignment. According to some embodiments, the implantation of dopant ions may be performed at a dose of $0.7 \times 10^{15}$ cm$^{-2}$ to $1.0 \times 10^{16}$ cm$^{2}$. The beam acceleration may be performed in the range of 5 to 30 kiloelectron volts (keV).

At operation 215, the implanted substrate may be subjected to a heating step to form a p-n junction 25 and a selective emitter. According to some embodiments, the substrate may be introduced into a furnace for annealing, for example an automated quartz tube furnace. The inner diameter of the quartz tube may be about 290 millimeters to accommodate 156 millimeter pseudosquare substrates. The annealing operation 215 may be used to accomplish several objectives at once. First, the annealing operation 215 may activate the implanted dopant ions, that is, the heat energy of the anneal operation creates vacancies in the silicon lattice for the dopant ions to fill. Second, the annealing may drive the dopant ions deeper, for example to a desired junction depth, into the substrate to form the p-n junction 25. Third, the annealing operation 215 may repair damage to the crystalline lattice of the substrate caused by ion implantation. Fourth, the annealing operation 215 may be used to lightly dope the field regions 20 between the selective regions 15.

According to example embodiments, the annealing operation 215 may begin by loading 1 to 400 substrates into a furnace at a temperature in the range of 700 to 900 degrees Celsius. In some embodiments, a large number of substrates may be simultaneously loaded into the furnace, for example up to 400 substrates may be loaded during a single furnace cycle. Once the substrates are loaded into the furnace, the temperature may be ramped up to a temperature in the range of 800 to 900 degrees Celsius over a period of 10 to 30 minutes. This temperature may then be maintained for 30 to 100 minutes. Next, the temperature may be ramped down to a temperature in the range of 700 to 900 degrees Celsius over a period of 3 to 30 minutes. The substrates may then be removed from the furnace.

During a portion of the time when the temperature is maintained, additional dopant atoms may be introduced to the furnace for diffusion into the front surface of the p-type base layer 10. The additional dopant may comprise the same type atoms as those implanted during the ion implantation step, or, alternatively another type of dopant atoms of the same conductivity. In certain embodiments, the additional dopant atoms may also diffuse into the back surface of the p-type base layer 10 if it is exposed. For example, a nitrogen carrier gas may be passed through a bubbler containing liquid dopant. The liquid dopant may comprise phosphorus oxychloride ($POCl_3$). In this regard, the nitrogen carrier gas collects molecules of the $POCl_3$ to be carried to the furnace. In the furnace, phosphorus dopant atoms from the $POCl_3$ may be diffused into the front and back surfaces of the p-type base layer 10. According to some embodiments, the dopant atoms may be diffused into the back surface of the p-type base layer 10 and both field regions 20 and selective regions 15 of the front surface of the p-type base layer 10. The diffusion may lightly dope the field regions 20 between the selective regions 15 to a sheet resistance of 70 to 120 Ohms per square. Additionally, the diffusion may supplement the selective regions 15 so that the selective regions 15 are more heavily doped than the field regions 20 between the selective regions 15, thus forming a selective emitter layer on the front surface of the p-type base layer 10. Alternatively, the diffusion may only occur at field regions 20, for example if a superstrate mask or mask layer is used to cover the selective regions 15. In these embodiments, the selective regions 15 still may be more heavily doped than the field regions 20 if the ion implantation step of the selective regions 15 in operation 210 is performed at a higher dose. Accordingly, a selective emitter layer formed by a hybrid diffusion-ion implantation process may be formed in a single high temperature anneal step.

According to various embodiments, the sheet resistance in the selective regions 15 of the selective emitter layer may be in the range of 30 to 50 Ohms-per-square. Additionally, the sheet resistance in the field regions 20 of the selective emitter layer may be in the range of 80 to 120 Ohms-per-square, preferably 100 Ohms-per-square. Such a high sheet resistance in the emitter field regions 20 may be challenging to achieve with a high degree of uniformity when a large number of substrates are introduced to a single furnace cycle. The sheet resistance and doping profile in the field regions 20, and even the selective regions 15, may be controlled by the diffusion time, carrier gas flow rate, drive-in time (i.e. the time at peak temperature with no carrier gas flowing into the furnace), and process temperatures. These process parameters may be modified to improve the sheet resistance uniformity and raise or lower the sheet resistance in respective regions.

In various embodiments, a glass layer may also be formed on the front surface of the doped regions 15, 20 of the selective emitter layer due to the diffusion process, for example a phosphosilicate glass layer. According to some embodiments, the glass layer may need to be removed prior to forming the antireflection layer 40 in operation 220 below. An example method for removing the glass layer comprises immersing the substrate in a bath of dilute hydrofluoric acid, which may have a concentration of about 1-20%, with 10% yielding excellent results.

At operation 220, an antireflection layer 40 may be formed on the front surface of the doped regions 15, 20 of the selective emitter layer. The antireflection layer 40 may have an index of refraction higher than the underlying substrate, thus enabling more light to pass into the antireflection layer 40 and to the interior of the substrate and reducing light reflection from the front side of the solar cell 5. The antireflection layer 40 may be composed of silicon nitride ($SiN_x$), aluminum oxide ($Al_2O_3$), titanium oxide ($TiO_2$), magnesium fluoride ($Mg_2F$), or zinc sulfide ($ZnS_2$), or combinations of these materials. In certain embodiments, the antireflection layer 40 may comprise an amorphous nitride, such as amorphous silicon nitride ($a-SiN_x$). The antireflection layer 40 may be formed by plasma enhanced chemical vapor deposition (PECVD). Alternatives to the PECVD process may include low pressure chemical vapor deposition (LPCVD), sputtering, and the like. The PECVD process may include heating the substrate to a temperature in the range of 300 to 500 degrees Celsius. Additionally, the PECVD process may include using silane and ammonia reactant gases. The antireflection layer 40 may have a thickness from 70 to 90 nanometers and an index of refraction of about 2.00. The thickness and index of refraction of the antireflection layer 40 may be determined by parameters such as deposition time, plasma power, flow rate of reactant gasses, and the deposition pressure.

At operation 225, the material for the front contacts 30 and front connections of the solar cell 5 may be applied to the front surface of the antireflection layer 40. According to various embodiments, the front contacts 30 and front connections may be screen-printed using a semi-automatic screen printer with optical alignment. The front contacts 30 and front connections may be applied using a silver paste, for example Heraeus SOL953 or the like. In some embodiments, the silver paste may be a fitted silver paste to help penetrate the antireflection layer 40 during firing of the contacts. The silver paste may be optimized specifically for forming contacts to emitters with low phosphorus doping. The configuration and spacing of the front contacts 30 and front connections may be defined by the contact pattern of the screen. In certain embodiments, the front contacts 30 can be 50 to 150 micrometers in width and spaced apart by 1.5 to 2.5 millimeters. The paste for the front contacts 30 and the front connections may be subsequently dried with a belt furnace. Alternatively, the front contacts 30 and front connections may be dried simultaneously with the back contact 35 and back connections, as described in operation 230 below.

In various example embodiments, the pattern of the screen, such as a grid pattern, line pattern, or the like, may be designed specifically for the selective emitter layer formed by the method described above. For example, the pattern of the front contacts 30 may be designed so that they are aligned and printed within the selective regions 15 of the selective emitter layer. In certain embodiments, the width of the front contacts 30 may be less than the width of the selective regions 15 to ensure that the front contacts 30 are entirely within the selective regions 15. The heavy doping in these selective regions 15 also may increase the depth of the p-n junction 25 underneath, which may prevent shunting or firing through the p-n junction 25 by components of the metal paste used to form the front contacts 30. According to example embodiments, alignment of the front contacts 30 with the selective regions 15 of the selective emitter layer may be accomplished through a variety of techniques known to those of ordinary skill, including optical alignment using the reference edge described above in operation 210 or another fiducial mark formed on the solar cell 5 to indicate a position relative to which alignment is to be performed, butt-edge alignment against two posts, alignment by camera to the center or edge of the substrate, or the like.

At operation 230, the material for the back contact 35 and back connections may be applied to the back surface of the p-type base layer 10. In certain embodiments, the back contact 35 and back connections may be screen-printed on the back surface of the p-type base layer 10. The back contact 35 may be applied using an aluminum paste, for example Monocrystal Analog 12D or the like. Additionally, the back connections may be applied using an aluminum-silver paste, for example Monocrystal PPAS-7-1 or the like. According to example embodiments, the back connections, such as solderable pads and bus bars, may be applied to the back surface of the p-type base layer 10 prior to the application of the back contact 35. The back contact 35 may be printed to overlap the edges of the back connections while leaving a portion of the back connections exposed. In example embodiments, the back contact 35 and back connections may be screen-printed across nearly the entire back surface of the p-type base layer 10. In these embodiments, the aluminum paste of the back contacts 35 may not be printed over a narrow border near the edges of the wafer approximately 1 mm wide. Alternatively, the back contacts 35 and back connections may be printed across only a portion of the back surface of the p-type base layer 10. The solar cell 5 may optionally be placed on a belt furnace at a temperature of 150 to 350 degrees Celsius in air ambient for 30 to 300 seconds to dry the printed paste.

At operation 235, the substrate with the contacts 30, 35 and connections applied may be heated or co-fired in a belt furnace, such as an in-line belt furnace or the like. In the process of co-firing the structure, the front contacts 30 and front connections may fire through the antireflection layer 40 to form a physical connection with the doped regions 15, 20 of the selective emitter layer. In various embodiments, the front contacts 30 may only make physical connection with the selective regions 15 of the selective emitter layer. To facilitate firing through the antireflection layer 40, the front contacts 30 and front connections may contain frit, such as glass frit or the like. The glass frit in the paste used to form the front contacts 30 and front connections may melt at a temperature near 500 degrees Celsius and dissolve the underlying antireflection layer 40. The firing temperature may be chosen such that the metal particles, such as silver, in the front contact paste form ohmic contact with the selective emitter layer without migrating below the depth of the emitter.

During the co-firing at operation 235, the material of the back contact 35 and back connections may form a physical contact with the back surface of the p-type base layer 10. In certain embodiments, the firing of the back contact 35 and back connections may occur above the aluminum-silicon eutectic temperature of 577 degrees Celsius. When the substrate cools following the co-firing, an aluminum-doped $p^+$ silicon back surface field layer 45 may form on the back surface of the p-type base layer 10 by liquid phase epitaxial re-growth. In these embodiments, the back contact 35 may be in electrical communication with the back surface field layer 45. The temperature profile may feature a high heating rate, in the range of 20 degrees Celsius per second to 150 degrees Celsius per second, that promotes formation of a uniform $p-p^+$ interface between the textured back surface of the p-type base layer 10 and the back surface field layer 45. Additionally, an aluminum back contact 35 may also be formed on the back surface of the back surface field layer 45 during cooling.

The front and back connections may also become sintered or bonded to respective front and back contacts 30, 35 so that they are integrally connected and form good electrical connection to respective front and back sides of the solar cell 5. Connections may be adjoined via soldered wires to adjacent solar cells in a solar module and ultimately to a load to provide power thereto upon exposure of the solar cell to light.

At operation 240, a junction isolation step is performed. According to some embodiments, a laser may be used to perform edge isolation. The laser may be a 1064 nm infrared laser. In various embodiments, the junction isolation step may form an approximately 100 μm wide trench 50 that is approximately 30 μm deep. The trench may be located approximately 100 to 200 μm from the lateral edges of the solar cell 5.

Another example method for manufacturing a solar cell with selective emitter formed by a hybrid ion implantation and diffusion process according to an embodiment of the present invention is described below.

The first operations of the example method are identical to operations 200 and 205 as described above with respect to FIG. 2a. In the example method, the substrate may be introduced to a furnace, for example an automated quartz tube furnace, for diffusion of a dopant into the front surface of the base layer 10. For example, a nitrogen carrier gas may be passed through a bubbler containing liquid dopant. The liquid dopant may comprise phosphorus oxychloride ($POCl_3$). In this regard, the nitrogen carrier gas may collect molecules of the $POCl_3$ to be carried to the furnace. In the furnace, phosphorus dopant atoms from the $POCl_3$ may be diffused into the front surface of the p-type base layer 10. According to some embodiments, the dopant atoms may be diffused into the entire front surface (i.e. both field regions 20 and selective regions 15). Alternatively, the diffusion may only occur at field regions 20, for example if a supersubstrate mask or mask layer is used to cover the selective regions 15. The amount of dopant introduced may be sufficient to dope the field region to a sheet resistance of 70 to 120 Ohms per square. The layer of dopant may have a conductivity opposite to that of the base layer 10. Thus, if the base layer 10 has p-type conductivity, then the layer of dopant introduced in operation 210 may have n-type conductivity. Conversely, if the base layer 10 has n-type conductivity, then the dopant atoms may have p-type conductivity. In certain embodiments, the n-type dopant may be phosphorus ions, for example $P^{31+}$.

According to the example method, the substrate may be subjected to a heating step to form a p-n junction 25 and an intermediate uniform emitter layer. According to example embodiments, the heating step may begin by loading the substrates into a furnace at a temperature in the range of 700 to 900 degrees Celsius. In some embodiments, a large number of substrates may be simultaneously loaded into the furnace, for example up to 400 substrates may be loaded during a single furnace cycle. Once the substrates are loaded into the furnace, the temperature may be ramped up to a value in the range of 800 to 900 degrees Celsius over a period of 10 to 30 minutes. This temperature may then be maintained for 30 to 100 minutes. Next, the temperature may be ramped down to 700 to 900 degrees Celsius over a period of 3 to 30 minutes. The substrates may then be removed from the furnace. Accordingly, a selective emitter layer formed by a hybrid diffusion-ion implantation process may be formed in a single high temperature anneal step.

The example method further comprises removing the newly formed glass from the substrate. During the diffusion step, a glass, for example a phosphosilicate glass, may form on the entire front surface of the intermediate uniform emitter layer and the back surface of the p-type base layer 10. Accordingly, the glass layer may need to be removed prior to subsequent steps. An example method for removing the glass layer comprises immersing the substrate in a bath of dilute hydrofluoric acid, which may have a concentration of about 1-20%, with 10% yielding excellent results.

In the example method, additional dopant atoms may be introduced to the front surface of the intermediate uniform emitter layer in the selective regions 15. According to various embodiments, the dopant atoms may be introduced by ion implantation. Patterning of the selective regions 15 may be achieved by performing the ion implantation through a mask, for example a graphite mask. The graphite mask may have openings from 300 to 500 micrometers wide and having a length equal to or greater than the width of the substrate, for example 156 millimeters or more. During the implantation, one edge of the substrate may be aligned with the edge of the mask by gravity. This reference edge may be marked, for example with a diamond pen, to be referenced in later steps when forming the front contacts to achieve edge alignment. According to some embodiments, the implantation of dopant ions may be performed at a dose of $1.0 \times 10^{15}$ cm$^{-2}$ to $1.0 \times 10^{16}$ cm$^{-2}$. The beam acceleration may be performed in the range of 10 kiloelectron volts to 30 kiloelectron volts. By performing the ion implantation after the diffusion process, it may be possible to keep the implanted dose of dopant close to the surface since the implanted ions are not subjected to a high temperature anneal.

According to the example method, the substrate may be subjected to a brief relatively low-temperature anneal. According to various embodiments, the length of the low-temperature anneal may be from 1 to 20 minutes, preferably 5 minutes. During this time, the temperature may be in the range of 400 to 600 degrees Celsius. The low-temperature anneal may convert the intermediate uniform emitter layer into a selective emitter layer due to the fact that the selective regions 15 are more heavily doped than the field regions 20.

The remaining operations of the example method are identical to operations 220 to 240 as described above with respect to FIGS. 2b and 2c.

According to various embodiments, and as described above, a solar cell may be formed with a selective emitter layer formed by a hybrid process involving both ion implantation and diffusion. Many advantages may be realized by forming the selective emitter layer as described herein. For example, according to various example embodiments, the selective emitter layer may be formed in a single high temperature anneal step. Additionally, according to certain embodiments, the problem of iron contamination induced lifetime degradation and instability inherent in ion implanted selective emitters may be solved by the hybrid ion implantation/diffusion process. Moreover, according to various embodiments, a solar cell may be produced with a selective emitter layer having a selective region with high enough dopant concentration at the surface and a deep enough junction underneath to give fill factors at or exceeding 0.800 and cell efficiencies of about 19%, even with low-cost, but high-quality, screen-printed contacts. Furthermore, these improvements greatly reduce the amount of time, equipment and expense needed to produce the solar cell, and greatly increase the throughput of the manufacturing process.

Many modifications and other embodiments of the inventions set forth herein will come to mind to one skilled in the art to which these inventions pertain having the benefit of the teachings presented in the foregoing descriptions and the associated drawings. Therefore, it is to be understood that the embodiments of the invention are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of steps, elements, and/or materials than those explicitly described above are also contemplated as may be set forth in some of the appended claims. Accordingly, the specification and drawings are to be regarded in an illustrative rather than restrictive sense. Although specific terms are employed herein, they are used in a generic and descriptive sense only and not for purposes of limitation.

What is claimed is:

1. A solar cell comprising:
a substrate comprising a p-type base layer;
an n-type selective emitter layer disposed over the p-type base layer,
the n-type selective emitter layer comprising:
one or more first doped regions and one or more second doped regions, wherein the one or more first doped regions are more heavily doped than the one or more second doped regions, and wherein a resistance ratio between the one or more first doped regions and the one or more second doped regions is from about 0.25 to about 0.625; and
a p-n junction at the interface of the base layer and the selective emitter layer;
wherein the selective emitter is formed by the use of a hybrid diffusion and ion implantation process, wherein the one or more first dosed regions comprise an ion implanted dopant, wherein the ion implanted dopant comprises phosphorous, wherein the one or more second doped regions comprise a diffused dopant, wherein the diffused dopant is formed by introducing a dopant for diffusion in the form of phosphorous oxychloride ($POCl_3$), and wherein an additional dopant is diffused into a front surface of the base layer, creating misfit dislocations in the selective emitter layer to provide a sink for iron gettering; and injecting interstitials into the substrate to drive iron from substitutional sites into interstitial sites such that the iron diffuses rapidly to the gettering sink.

2. The solar cell of claim 1, the n-type selective emitter layer comprising a front surface, and the solar cell further comprising an antireflection layer disposed on the front surface of the selective emitter layer.

3. The solar cell of claim 2, the antireflection layer comprising a front surface, a base layer comprising a back surface, and the solar cell further comprising: one or more screen-printed front contacts disposed on the front surface of the antireflection layer in electrical communication with the selective emitter layer through the antireflection layer; and one or more screen-printed back contacts disposed on the back surface of the base layer.

4. The solar cell of claim 3, further comprising: an aluminum-doped $p^+$ back surface field layer at the interface of the base layer and the one or more back contacts, wherein the one or more back contacts are in electrical communication with the aluminum-doped $p^+$ back surface field layer.

5. The solar cell of claim 3, wherein the one or more front contacts are aligned with the more heavily doped one or more first doped regions of the selective emitter layer to reduce contact resistance, and wherein the one or more front contacts are in electrical communication with the one or more first doped regions of the selective emitter layer.

6. The solar cell of claim 1, wherein the p-n junction and the selective emitter layer are both formed during a single anneal cycle.

7. A solar cell having a selective emitter formed by the use of a hybrid diffusion and ion implantation process, manufactured by the steps of: providing a substrate comprising a base layer, wherein the base layer is doped with p-type dopant; introducing dopant to one or more selective regions of the front surface of the base layer by ion implantation to form an ion implanted dopant; and annealing the substrate, wherein annealing comprises heating the substrate in a furnace to a temperature to: diffuse additional dopant into the front surface of the base layer, wherein the additional dopant is introduced to the furnace during the anneal to form a diffused dopant; and form a selective emitter layer on the front surface of the base layer, wherein the one or more selective regions of the front surface of the base layer define one or more selective regions of the selective emitter layer that are more heavily doped than the remainder of the selective emitter layer, and wherein a resistance ratio between the one or more selective regions of the selective emitter layer and the remainder of the selective emitter layer is from about 0.25 to about 0.625; wherein the selective emitter layer is doped with an n-type dopant such that a p-n junction forms at the interface of the base layer and the selective emitter layer; wherein the ion implanted dopant comprises phosphorous; wherein the diffused dopant is formed by introducing a dopant for diffusion in the form of phosphorous oxychloride ($POCl_3$), and wherein diffusing an additional dopant into the front surface of the base layer further comprises: creating misfit dislocations in the selective emitter layer to provide a sink for iron gettering: and injecting interstitials into the substrate to drive iron from substitutional sites into interstitial sites such that the iron diffuses rapidly to the gettering sink.

8. A solar cell comprising:
a substrate comprising an n-type base layer;
a p-type selective emitter layer formed over the n-type base layer, the p-type
selective emitter layer comprising:
one or more first doped regions and one or more second doped regions, wherein the one or more first doped regions are more heavily doped than the one or more second doped regions, and wherein a resistance ratio between the one or more first doped regions and the one or more second doped regions is from about 0.25 to about 0.625; and
a p-n junction at the interface of the base layer and the selective emitter layer;
wherein the selective emitter layer is formed by the use of a hybrid diffusion and ion implantation process, wherein the one or more first doped regions comprise an ion implanted dopant, wherein the ion implanted dopant comprises phosphorous, wherein the one or more second doped regions comprise a diffused dopant, wherein the diffused dopant is formed by introducing a dopant for diffusion in the form of phosphorous oxychloride ($POCl_3$), and wherein an additional dopant is diffused into a front surface of the base layer, creating misfit dislocations in the selective emitter layer to provide a sink for iron gettering: and injecting interstitials into the substrate to drive iron from substitutional sites into interstitial sites such that the iron diffuses rapidly to the gettering sink.

9. The solar cell of claim 8, the selective emitter layer comprising a front surface, and the solar cell further comprising: an amorphous antireflection layer disposed on the front surface of the selective emitter layer.

10. The solar cell of claim 9, the antireflection layer comprising a front surface, a base layer comprising a back surface, and the solar cell further comprising: one or more screen-printed front contacts disposed on the front surface of the antireflection layer in electrical communication with the selective emitter layer through the antireflection layer; and one or more screen-printed back contacts disposed on the back surface of the base layer.

11. The solar cell of claim 10, wherein the one or more front contacts are aligned with the more heavily doped one or more first doped regions of the selective emitter layer to reduce contact resistance, and wherein the one or more front contacts are in electrical communication with the one or more first doped regions of the selective emitter layer.

12. The solar cell of claim 8, wherein the p-n junction and the selective emitter layer are both formed during a single anneal cycle.

* * * * *